(12) United States Patent
Sun et al.

(10) Patent No.: US 11,262,713 B2
(45) Date of Patent: Mar. 1, 2022

(54) METHOD FOR CALCULATING CONTROL PARAMETERS OF HEATING SUPPLY POWER OF HEATING NETWORK

(71) Applicant: Tsinghua University, Beijing (CN)

(72) Inventors: Hongbin Sun, Beijing (CN); Qinglai Guo, Beijing (CN); Bin Wang, Beijing (CN); Zhaoguang Pan, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 221 days.

(21) Appl. No.: 16/842,600

(22) Filed: Apr. 7, 2020

(65) Prior Publication Data

US 2020/0233386 A1 Jul. 23, 2020

Related U.S. Application Data

(63) Continuation of application No. PCT/CN2017/114466, filed on Dec. 4, 2017.

(30) Foreign Application Priority Data

Oct. 9, 2017 (CN) .......................... 201710927854.8

(51) Int. Cl.
*G05B 13/04* (2006.01)
*F01K 27/00* (2006.01)
(Continued)

(52) U.S. Cl.
CPC ............ *G05B 13/042* (2013.01); *F01K 27/00* (2013.01); *G06F 30/20* (2020.01); *H02J 3/381* (2013.01);
(Continued)

(58) Field of Classification Search
CPC ....... G05B 13/042; F01K 27/00; F01K 13/00; F01K 13/02; G06F 30/20; H02J 3/381;
(Continued)

(56) References Cited

U.S. PATENT DOCUMENTS

2012/0191440 A1* 7/2012 Meagher ................. H04L 67/10
703/18
2013/0253898 A1* 9/2013 Meagher ................ G06N 20/00
703/18

(Continued)

FOREIGN PATENT DOCUMENTS

CN 103219748 A * 7/2013 ................ H02J 3/46
CN 106294961 A * 1/2017 ............. G06F 17/50
CN 107067116 A * 8/2017 ............. G06Q 10/04

OTHER PUBLICATIONS

CN-107067116-A, machine language translation (Dec. 13, 2021).*
(Continued)

*Primary Examiner* — M. N. Von Buhr
(74) *Attorney, Agent, or Firm* — Hodgson Russ LLP

(57) ABSTRACT

A method for calculating control parameters of a heating supply power of a heating network, pertaining to the technical field of operation and control of a power system containing multiple types of energy. The method: establishing a heating network simulation model that simulates a thermal dynamic process of the heating network; starting an upward simulation based on the heating network simulation model to obtain first control parameters from a set of up adjustment amounts; starting a downward simulation based on the heating network simulation model, to obtain second control parameters from a set of down adjustment amounts.

6 Claims, 2 Drawing Sheets

(51) Int. Cl.
*G06F 30/20* (2020.01)
*H02J 3/38* (2006.01)

(52) U.S. Cl.
CPC ....... *H02J 2203/20* (2020.01); *H02J 2300/28* (2020.01); *Y04S 40/20* (2013.01)

(58) Field of Classification Search
CPC ... H02J 2203/20; H02J 2300/28; Y04S 40/20; Y02A 30/60; Y02E 20/14; Y02E 60/00
See application file for complete search history.

(56) References Cited

U.S. PATENT DOCUMENTS

| | | | | |
|---|---|---|---|---|
| 2014/0316584 | A1* | 10/2014 | Matsuoka | F24F 11/62 |
| | | | | 700/278 |
| 2016/0172854 | A1* | 6/2016 | Zhou | H02J 3/466 |
| | | | | 700/291 |
| 2017/0046458 | A1* | 2/2017 | Meagher | H02J 13/00017 |
| 2017/0317528 | A1* | 11/2017 | Fife | H02J 13/0006 |
| 2019/0019096 | A1* | 1/2019 | Yoshida | G06F 16/9024 |
| 2021/0033748 | A1* | 2/2021 | Rowan | G06F 30/27 |

OTHER PUBLICATIONS

CN-106294961-A, machine language translation (Dec. 13, 2021).*
CN-103219748-A, machine language translation (Dec. 13, 2021).*
WIPO, ISR for PCT/CN2017/114466, Jun. 27, 2018.

* cited by examiner

METHOD FOR CALCULATING CONTROL PARAMETERS OF HEATING SUPPLY POWER OF HEATING NETWORK

CROSS-REFERENCE TO RELATED APPLICATION

This is a continuation of International Application No. PCT/CN2017/114466 filed Dec. 4, 2017, which claims priority to Chinese Patent Application No. 201710927854.8, filed Oct. 9, 2020, the entire disclosures of which are incorporated herein by reference.

FIELD

The present disclosure relates to a method for calculating control parameters of a heating supply power of a heating network, belongs to the field of operation and control technologies for a power system with a plurality of energy forms.

BACKGROUND

With the consumption of fossil energy and the outstanding of environment problems, renewable energy has developed rapidly in recent years. However, lots of renewable energy may be limited by natural conditions, thus it has the strong randomness and volatility in electric output. Especially, the predictability of wind power generation and photovoltaic power generation is poor. A large number of uncertain renewable energy have challenged the safe and stable operation of the power grid because the power grid requires the real-time power balance, leading to a large number of abandoned wind power generation and photovoltaic power generation. Meanwhile, conventional thermal power generation will gradually decrease, resulting in a decrease in conventional controllable resources. Therefore, it is urgent to find new controllable resources to enhance the flexibility of power grid control.

In the development of the energy internet, multi-energy flow is an important feature. Multi-energy flow breaks the status quo of conventional independent management of different energy and achieves the synergy among different energy forms, which may bring many benefits. In China, especially in the northern regions, increasing coupling components such as cogeneration units, heat pumps, electric boilers, have objectively strengthened the interconnection between electricity and heating network, and promoted the development of the electric-heating coupled multi-energy flow system. The heating network has a great thermal inertia, which makes it possible to change the heating supply power within a certain period of time with a small impact on the heating load. Therefore, the change of power generation or electrical load related to the heating network can provide resources with considerable flexibility for power grid operation.

SUMMARY

The method for calculating control parameters of a heating supply power of a heating network, provided by the present disclosure, may include the following steps: establishing a heating network simulation model that simulates a thermal dynamic process of the heating network; starting an upward simulation based on the heating network simulation model to obtain first control parameters from a set of up adjustment amounts; starting a downward simulation based on the heating network simulation model, to obtain second control parameters from a set of down adjustment amounts.

DETAILED DESCRIPTION

Figure 1:
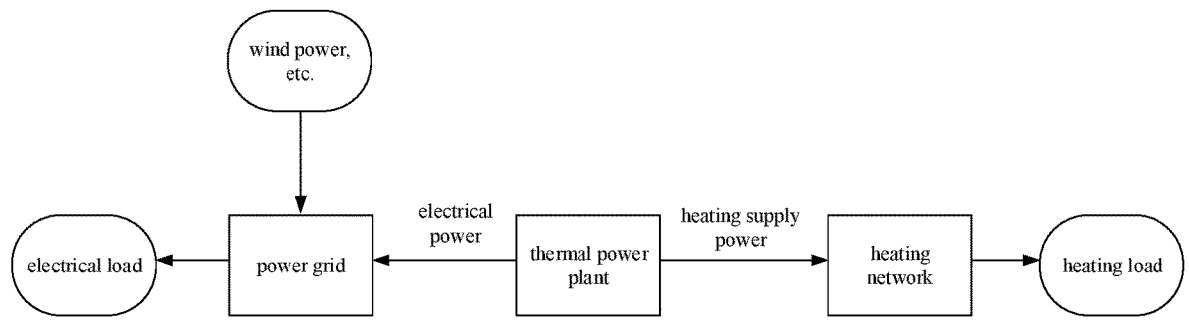
FIG. 1 is a schematic diagram of a relationship between a power grid and a heating network according to an embodiment of the present disclosure.

The method for calculating control parameters of a heating supply power of a heating network, provided by the present disclosure, may be described in the following. The relationship between the power grid and the heating network involved in this method is shown in FIG. 1. The heating network is coupled to the thermal power plant. The thermal power plant is coupled to the power grid. The thermal power plant provides the heating supply power to the heating network while provides the electrical power to the power grid. The thermal power plant may control the heating supply power to the heating network based on the control parameters of the heating supply power obtained in this method.

Figure 2:
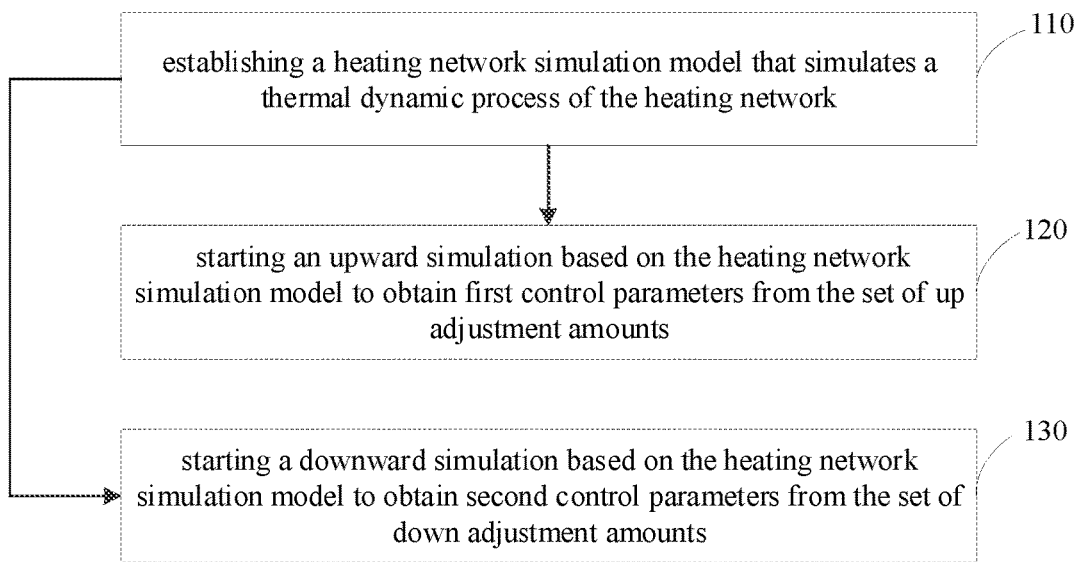
FIG. 2 is a flowchart of a method for calculating control parameters of a heating supply power of a heating network according to an embodiment of the present disclosure.

As illustrated in FIG. 2, the method may include the following operations: establishing a heating network simulation model that simulates a thermal dynamic process of the heating network (110); starting an upward simulation based on the heating network simulation model to obtain first control parameters from the set of up adjustment amounts (120); and starting a downward simulation based on the heating network simulation model to obtain second control parameters from the set of down adjustment amounts (130).

The detail of the present disclosure may be described as follows.

(1) Based on an actual design and operation of the heating network, a heating network simulation model that simulates a thermal dynamic process of the heating network is established, which includes: setting parameters of devices in the heating network, establishing a topology connection relationship among the devices in the heating network, setting limits of operating parameters of the heating network, and setting parameters related to operation modes of some devices in the heating network. The limits of operating parameters of the heating network include: the upper and lower limit for the mass flow in the heating network, and the upper and lower limit for the pressure in the heating network. The parameters related to the operation modes include: the position and the pressure of one or more constant pressure points in the heating network, and the operation modes of one or more circulation pumps in the heating network.

(2) A starting time $t_1$ when the heating network is required to adjust the heating supply power, is obtained from a dispatching center of the power grid; safe operation constraints of the heating network are obtained from heating network operation regulations of a heating company, including: an allowable maximum temperature $T_{max}$ of the heating network, an allowable minimum temperature $T_{min}$ of the heating network, an allowable maximum heating supply power $P_{max}$ of the heating network, and an allowable minimum heating supply power $P_{min}$ of the heating network; an initial operation plan of the heating network is obtained from a dispatching system of the heating network, including: a planned heating supply power $P_s$ of a simulation duration, a planned heating supply temperature $T_s$ of the simulation duration, a predicted heating load $L_s$ of the simulation duration; the heating supply power at time $t_1$ is obtained from the dispatching system of the heating network and denoted by $P_{t1}$.

(3) An upward step change of the heating supply power is set to $\Delta P_{up}$, where $\Delta P_{up} = (P_{max} - P_{t1})/5$, and a counter k=1 is set.

(4) In the heating network simulation model of the step (1), the heating supply power P is set to the planned heating supply power $P_s$, the heating supply temperature T is set to the planned heating supply temperature $T_s$, and the heating load L is set to the predicted heating load $L_s$; a simulation calculation is started based on the planned heating supply power $P_s$, the planned heating supply temperature $T_s$, and the predicted heating load $L_s$ until time $t_1$; at time $t_1$, the heating supply power P is updated to $P = P_s + k\Delta P_{up}$, where the counter k=1; and the control mode of the heating network is changed during the simulation calculation process; a comparison of the heating network temperature with the allowable maximum temperature $T_{max}$ of the heating network and the allowable minimum temperature $T_{min}$ of the heating network is carried out, the control mode of the heating network is changed according to the result of the comparison, the simulation calculation is continued until the end, and the details are as follows:

(4-1) If the heating network temperature during the simulation calculation is greater than or equal to the allowable maximum temperature $T_{max}$ of the heating network in the step (2), the heating supply temperature T is set to the allowable maximum temperature $T_{max}$ of the heating network and is kept to be unchanged, and the control mode of heating network is set as: the heating supply power P is variable; the simulation calculation is continued until the end, and a time sequence of the heating supply powers $P_k$ is obtained.

(4-2) If the heating network temperature during the simulation calculation is less than or equal to the allowable minimum temperature $T_{min}$ of the heating network in the step (2), the heating supply temperature T is set to the allowable minimum temperature $T_{min}$ of the heating network and is kept to be unchanged, and the control mode of heating network is set as: the heating supply power P is variable; the simulation calculation is continued until the end, and a time sequence of the heating supply powers $P_k$ is obtained.

(4-3) If the heating network temperature during the simulation calculation is less than the allowable maximum temperature $T_{max}$ of the heating network and greater than the allowable minimum temperature $T_{min}$ of the heating network, the heating supply power P is set to $P = P_s + k\Delta P_{up}$, and the control mode of heating network is set as: the heating supply temperature T is variable; the simulation calculation is continued until the end, and a time sequence of the heating supply powers $P_k$ is obtained.

(5) Each heating supply power $P_k$ obtained in the step (4) subtracts the planned heating supply power $P_s$ obtained in the step (2), i.e., $P_k - P_s$, to obtain an up adjustment amount of the heating supply power.

Figure 3:
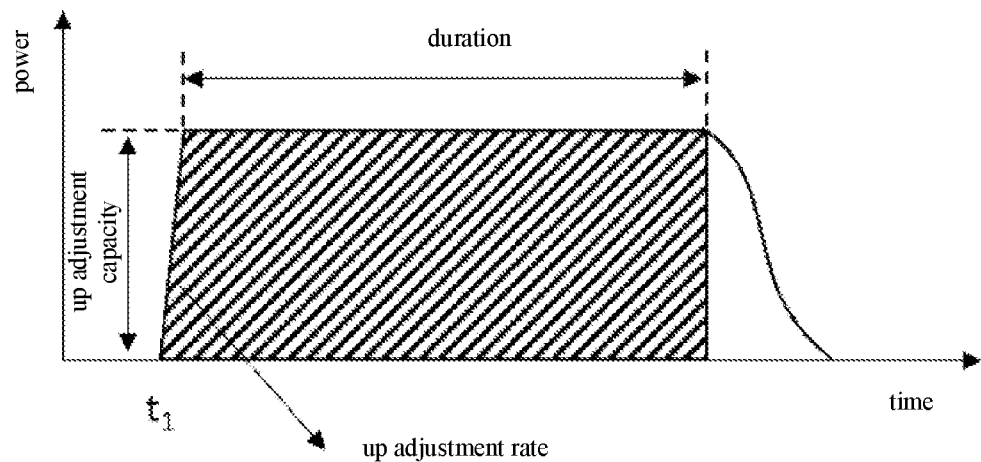
FIG. 3 is a schematic diagram of a curve of up adjustment amounts of a heating supply power according to an embodiment of the present disclosure.

Taking ordinate with the up adjustment amount of the heating supply power and abscissa with simulation time, a curve of the up adjustment amounts of the heating supply power is obtained. As shown in FIG. 3, the abscissa in FIG. 3 is the simulation time, and the ordinate in FIG. 3 is the up adjustment amounts of the heating supply power. The shaded part in FIG. 3 is defined as the up adjustment capability of the heating supply power. A set of parameters $\Omega_{up,k}$ for describing the up adjustment capability of the heating supply power, is calculated. $\Omega_{up,k}$ includes an up adjustment capacity of the heating supply power, an up adjustment rate of the heating supply power, and an up adjustment duration of the heating supply power. A maximum absolute value of the up adjustment amounts of the heating supply power is used as the up adjustment capacity of the heating supply power. A value that the maximum absolute value of the up adjustment amounts of the heating supply power ÷ a duration required for the up adjustment amount of the heating supply power from 0 to the maximum absolute value, is used as the up adjustment rate of the heating supply power. A duration of the maximum absolute value of the up adjustment amounts of the heating supply power is used as the up adjustment duration of the heating supply power. The counter k is increased by 1, the steps (4) and (5) are repeated until the up adjustment capacity of the heating supply power, the up adjustment rate of the heating supply power, and the up adjustment duration of the heating supply power remain unchanged.

(6) Based on all sets of parameters $\Omega_{up,k}$ for describing the up adjustment capability of the heating supply power, obtained by repeating the step (4) and the step (5), a set is formed, which is an up adjustment capability model of the heating supply power.

(7) A downward step change of the heating supply power is set to $\Delta P_{down}$, where $\Delta P_{down} = (P_{t1} - P_{min})/5$, and a counter k=1 is set.

(8) In the heating network simulation model of the step (1), the heating supply power P is set to the planned heating supply power $P_s$, the heating supply temperature T is set to the planned heating supply temperature $T_s$, and the heating load L is set to the predicted heating load $L_s$; a simulation calculation is started until time $t_1$, the heating supply power P is set to $P = P_s - k\Delta P_{down}$, and the control mode of heating network is changed during the simulation calculation process: a comparison of heating network temperature with the allowable maximum temperature $T_{max}$ of the heating network and the allowable minimum temperature $T_{min}$ of the heating network is carried out, the control mode of the heating network is changed according to the result of the comparison, the simulation calculation is continued until the end, and the details are as follows:

(8-1) If the heating network temperature during the simulation calculation is greater than or equal to the allowable maximum temperature $T_{max}$ of the heating network in the step (3), the heating supply temperature T is set to the allowable maximum temperature $T_{max}$ of the heating network and is kept to be unchanged, and the control mode of the heating network is set as: the heating supply power P is variable; the simulation calculation is continued until the end, and a time sequence of the new heating supply powers $P_k$ is obtained.

(8-2) If the heating network temperature during the simulation calculation is less than or equal to the allowable minimum temperature $T_{min}$ of the heating network in the step (2), the heating supply temperature T is set to the allowable minimum temperature $T_{min}$ of the heating network and is kept to be unchanged, and the control mode of heating network is set as: the heating supply power P is variable; the simulation calculation is continued until the end, and a time sequence of the new heating supply powers $P_k$ is obtained.

(8-3) If the heating network temperature during the simulation calculation is less than the allowable maximum temperature $T_{max}$ of the heating network and greater than the allowable minimum temperature $T_{min}$ of the heating network, the heating supply power P is set to $P=P_s-k\Delta P_{down}$, and the control mode of heating network is set as: the heating supply temperature T is variable; the simulation calculation is continued until the end, and a time sequence of the new heating supply powers $P_k$ is obtained.

(9) The planned heating supply power $P_s$ obtained in the step (2) subtracts each heating supply power $P_k$ obtained in the step (8), i.e., $P_s-P_k$, to obtain a down adjustment amount of the heating supply power.

Figure 4:
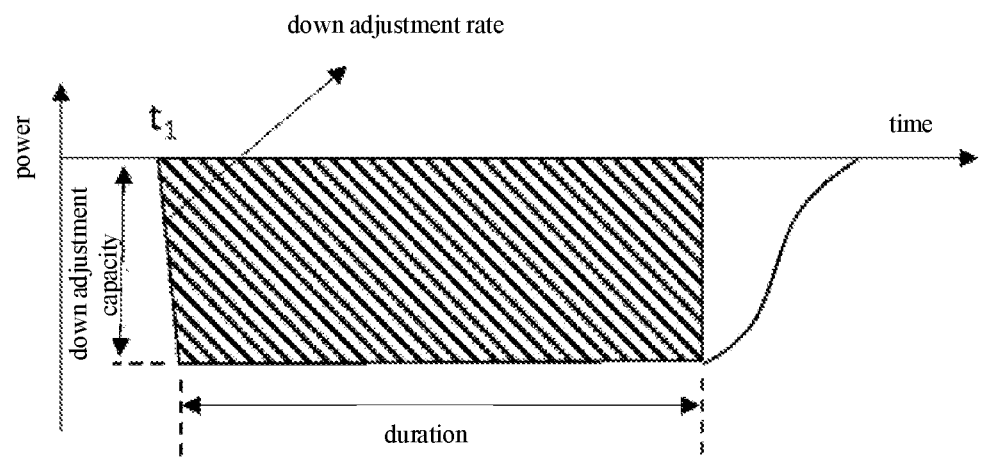
FIG. 4 is a schematic diagram of a curve of down adjustment amounts of a heating supply power according to an embodiment of the present disclosure.

Taking ordinate with the down adjustment amount of the heating supply power and abscissa with simulation time, a curve of the down adjustment amounts of the heating supply power is obtained. As shown in FIG. 4, the abscissa in FIG. 4 is the simulation time, and the ordinate in FIG. 4 is the down adjustment amount of the heating supply power. The shaded part in FIG. 4 is defined as the down adjustment capability of the heating supply power. A set of parameters $\Omega_{down,k}$ for describing an down adjustment capability of the heating supply power, is calculated. $\Omega_{down,k}$ includes an down adjustment capacity of the heating supply power, an down adjustment rate of the heating supply power, and an down adjustment duration of the heating supply power. A maximum absolute value of the down adjustment amounts of the heating supply power is used as the down adjustment capacity of the heating supply power. A value that the maximum absolute value of the down adjustment amounts of the heating supply power ÷ a duration required for the down adjustment amount of the heating supply power from 0 to the maximum absolute value, is used as the down adjustment rate of the heating supply power. A duration of the maximum absolute value of the down adjustment amounts of the heating supply power is used as the down adjustment duration of the heating supply power. The counter k is increased by 1, the steps (8) and (9) are repeated until the down adjustment capacity of the heating supply power, the down adjustment rate of the heating supply power, and the down adjustment duration of the heating supply power remain unchanged.

(10) Based on all sets of parameters $\Omega_{down,k}$ for describing the down adjustment capability of the heating supply power, obtained by repeating the step (9) and step (10), a set is formed, which is a down adjustment capability model of the heating supply power.

(11) The up adjustment capability model of the heating supply power, obtained in the step (6), and the down adjustment capability model of the heating supply power, obtained in the step (10), are combined to obtain an adjustable capability model of the heating supply power.

The method provided by the present disclosure, may include the following characteristics and advantages.

The method may be provided by the present disclosure based on the thermal dynamic simulation of the heating network, which may describe the heating network flexibility more accurately. The adjustable capability model of the heating supply power is presented in a concise and standardized form. The parameters have clear meanings and may be more widely used in practical power systems. The method may be applied to the online operation of the electric-heating coupled multi-energy flow system. When the flexibility of the power system is insufficient, the flexibility of the heating network may be invoked by adjusting the heating supply power of the heating network and the generation power of the thermal power plant, which is beneficial to deal with the adverse impact of uncertainty of renewable energy on the operation of power systems.

What is claimed is:

1. A method for calculating control parameters of a heating supply power of a heating network, wherein the heating network is coupled to a thermal power plant, the thermal power plant is coupled to a power grid, the thermal power plant provides the heating supply power to the heating network while provides an electrical power to the power grid, and the method comprises:

establishing a heating network simulation model that simulates a thermal dynamic process of the heating network;

starting an upward simulation based on the heating network simulation model, comprising:
  setting a heating supply power P to an initial heating supply power, and a heating supply temperature T to an initial heating supply temperature;
  simulating the heating network simulation model based on the initial heating supply power and the initial heating supply temperature until time $t_1$;
  at time $t_1$, updating the heating supply power P to $P=P_s+k\Delta P_{up}$, and setting the heating supply temperature T to be variable, in which $P_s$ represents the initial heating supply power, $\Delta P_{up}$ represents an upward step, and k represents a value of a counter;
  simulating the heating network simulation model based on the updated heating supply power, comparing a heating network temperature with an allowable maximum temperature $T_{max}$ and an allowable minimum temperature $T_{min}$;
  under a case that the heating network temperature is greater than or equal to the allowable maximum temperature $T_{max}$, setting the heating supply temperature T to the allowable maximum temperature $T_{max}$ and keeping the heating supply temperature T to be unchanged, setting the heating supply power P to be variable, simulating the heating network simulation model continually, obtaining a time sequence of simulated heating supply powers $P_k$ when the simulating the heating network simulation model ends;
  under a case that the heating network temperature is less than or equal to the allowable minimum temperature $T_{min}$, setting the heating supply temperature T to the allowable minimum temperature $T_{min}$ and keeping the heating supply temperature T to be unchanged, setting the heating supply power P to be variable, simulating the heating network simulation model continually, obtaining a time sequence of simulated heating supply powers $P_k$ when the simulating the heating network simulation model ends;
  under a case that the network heating temperature is less than the allowable maximum temperature $T_{max}$ and greater than the allowable minimum temperature $T_{min}$, setting the heating supply power P to $P=P_s+k\Delta P_{up}$, setting the heating supply temperature T to be variable, simulating the heating network simulation model continually, obtaining a time sequence of simulated heating supply powers $P_k$ when the simulating the heating network simulation model ends;
  obtaining a set of up adjustment amounts of the heating supply power by a formula of $P_k-P_s$ based on all simulated heating supply powers $P_k$;

obtaining first control parameters from the set of up adjustment amounts;

determining whether the first control parameters are changed;

in response to that the first control parameters are changed, increasing k by 1, and repeating the upward simulation until the first control parameters are unchanged;

starting a downward simulation based on the heating network simulation model, comprising:

setting a heating supply power P to an initial heating supply power, and a heating supply temperature T to an initial heating supply temperature;

simulating the heating network simulation model based on the initial heating supply power and the initial heating supply temperature until time $t_1$;

at time $t_1$, updating the heating supply power P to $P=P_s-k\Delta P_{down}$, and setting the heating supply temperature T to be variable, in which $P_s$ represents the initial heating supply power, $\Delta P_{down}$ represents an upward step, and k represents a value of a counter;

simulating the heating network simulation model based on the updated heating supply power, comparing a heating network temperature with an allowable maximum temperature $T_{max}$ and an allowable minimum temperature $T_{min}$;

under a case that the heating network temperature is greater than or equal to the allowable maximum temperature $T_{max}$, setting the heating supply temperature T to the allowable maximum temperature $T_{max}$ and keeping the heating supply temperature T to be unchanged, setting the heating supply power P to be variable, simulating the heating network simulation model continually, obtaining a time sequence of simulated heating supply powers $P_k$ when the simulating the heating network simulation model ends;

under a case that the heating network temperature is less than or equal to the allowable minimum temperature $T_{min}$, setting the heating supply temperature T to the allowable minimum temperature $T_{min}$ and keeping the heating supply temperature T to be unchanged, setting the heating supply power P to be variable, simulating the heating network simulation model continually, obtaining a time sequence of simulated heating supply powers $P_k$ when the simulating the heating network simulation model ends;

under a case that the network heating temperature is less than the allowable maximum temperature $T_{max}$ and greater than the allowable minimum temperature $T_{min}$, setting the heating supply power P to $P=P_s-k\Delta P_{down}$, setting the heating supply temperature T to be variable, simulating the heating network simulation model continually, obtaining a time sequence of simulated heating supply powers $P_k$ when the simulating the heating network simulation model ends;

obtaining a set of down adjustment amounts of the heating supply power by a formula of $P_s-P_k$ based on all simulated heating supply powers $P_k$;

obtaining second control parameters from the set of down adjustment amounts;

determining whether the second control parameters are changed;

in response to that the second control parameters are changed, increasing k by 1, and repeating the downward simulation until the second control parameters is unchanged;

in which, the first control parameters include an up adjustment capacity of the heating supply power, an up adjustment rate of the heating supply power, and an up adjustment duration of the heating supply power, and the second control parameters include a down adjustment capacity of the heating supply power, a down adjustment rate of the heating supply power, and a down adjustment duration of the heating supply power.

2. The method of claim 1, further comprising:
providing the first and second control parameters to the thermal power plant.

3. The method of claim 1, wherein $\Delta P_{up}=(P_{max}-P_{t1})/5$, $P_{min}$ represents an allowable minimum heating supply power of the heating network.

4. The method of claim 1, wherein $\Delta P_{down}=(P_{t1}-P_{min})/5$, $P_{max}$ represents an allowable maximum temperature of the heating network.

5. The method of claim 1, wherein a maximum absolute value of the up adjustment amounts of the heating supply power is used as the up adjustment capacity of the heating supply power, a value that the maximum absolute value of the up adjustment amounts of the heating supply power ÷ a duration required for the up adjustment amount of the heating supply power from 0 to the maximum absolute value, is used as the up adjustment rate of the heating supply power, a duration of the maximum absolute value of the up adjustment amounts of the heating supply power is used as the up adjustment duration of the heating supply power.

6. The method of claim 1, wherein, a maximum absolute value of the down adjustment amounts of the heating supply power is used as the down adjustment capacity of the heating supply power, a value that the maximum absolute value of the down adjustment amounts of the heating supply power ÷ a duration required for the down adjustment amount of the heating supply power from 0 to the maximum absolute value, is used as the down adjustment rate of the heating supply power, a duration of the maximum absolute value of the down adjustment amounts of the heating supply power is used as the down adjustment duration of the heating supply power.

* * * * *